(12) United States Patent
Johnson

(10) Patent No.: US 9,274,193 B2
(45) Date of Patent: Mar. 1, 2016

(54) METHOD FOR MAGNETIC RESONANCE IMAGING USING RADIAL CONES K-SPACE TRAJECTORIES

(71) Applicant: Kevin Michael Johnson, Madison, WI (US)

(72) Inventor: Kevin Michael Johnson, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 660 days.

(21) Appl. No.: 13/624,007

(22) Filed: Sep. 21, 2012

(65) Prior Publication Data

US 2014/0084919 A1    Mar. 27, 2014

(51) Int. Cl.
*G01R 33/54*    (2006.01)
*G01R 33/48*    (2006.01)

(52) U.S. Cl.
CPC ........ *G01R 33/4816* (2013.01); *G01R 33/4826* (2013.01)

(58) Field of Classification Search
CPC ........... G01R 33/4824; G01R 33/4816; G01R 33/4818; G01R 33/4826
USPC .......................................... 324/307, 309, 318
See application file for complete search history.

(56) References Cited

U.S. PATENT DOCUMENTS

| | | | |
|---|---|---|---|
| 5,532,595 A * | 7/1996 | Lampman et al. | 324/309 |
| 7,548,062 B1 * | 6/2009 | Gurney | 324/309 |
| 2011/0241680 A1 * | 10/2011 | Mossnang et al. | 324/309 |
| 2012/0243756 A1 * | 9/2012 | Samsonov et al. | 382/131 |

OTHER PUBLICATIONS

Krämer, P., et al. "3D radial twisted projection imaging for DCE-MRI with variable flip angles." Proc Intl Soc Mag Reson Med. vol. 19. 2011.*
Gurney, Paul T., Brian A. Hargreaves, and Dwight G. Nishimura. "Design and analysis of a practical 3D cones trajectory." Magnetic resonance in medicine 55.3 (2006): 575-582.*
Bergin, et al., Lung Parenchyma: Projection Reconstruction MR Imaging, Radiology, 1991, 179:777-781.
Irarrazabal, et al., Fast Three Dimensional Magnetic Resonance Imaging, Magnetic Resonance in Medicine, 1995, 33:656-662.
Lustig, et al., A Fast Method for Designing Time-Optimal Gradient Waveforms for Arbitrary k-Space Trajectories, IEEE Trans. Med. Imaging, 2008, 27(6):866-873.
Pipe, et al., A New Design and Rationale for 3D Orthogonally Oversampled k-Space Trajectories, Magnetic Resonance in Medicine, 2011, 66(5):1303-1311.

* cited by examiner

*Primary Examiner* — Melissa Koval
*Assistant Examiner* — Rishi Patel
(74) *Attorney, Agent, or Firm* — Quarles & Brady, LLP

(57) ABSTRACT

A method for magnetic resonance imaging (MRI) using a radial cone k-space trajectory is provided. The radial cone k-space trajectory is defined by the application of a radial magnetic field gradient and one or more oscillating magnetic field gradients. The amplitude of the radial magnetic field gradient increases with time before decreasing with time. While the amplitude of the radial magnetic field gradient is decreasing, the one or more oscillating magnetic field gradients are applied. As a result, the radial cone k-space trajectory is one that is oriented along an axis and that extends outward from an origin along a substantially radial trajectory before extending outward from the origin while circumscribing a conical volume having a radius that increases nonlinearly with distance from the origin.

10 Claims, 4 Drawing Sheets

METHOD FOR MAGNETIC RESONANCE IMAGING USING RADIAL CONES K-SPACE TRAJECTORIES

STATEMENT REGARDING FEDERALLY SPONSORED RESEARCH

This invention was made with government support under N5066982 awarded by the National Institutes of Health. The government has certain rights in the invention.

BACKGROUND OF THE INVENTION

The field of the invention is systems and methods for magnetic resonance imaging ("MRI"). More particularly, the invention relates to systems and methods for MRI using a radial cones trajectory to sample k-space.

MRI uses the nuclear magnetic resonance phenomenon to produce images. When a substance such as human tissue is subjected to a uniform magnetic field, such as the so-called main magnetic field, $B_0$, of an MRI system, the individual magnetic moments of the nuclei in the tissue attempt to align with this $B_0$ field, but precess about it in random order at their characteristic Larmor frequency, $\omega$. If the substance, or tissue, is subjected to a so-called excitation electromagnetic field, $B_1$, that is in the plane transverse to the $B_0$ field and that has a frequency near the Larmor frequency, the net aligned magnetic moment, referred to as longitudinal magnetization, may be rotated, or "tipped," into the transverse plane to produce a net transverse magnetic moment, referred to as transverse magnetization. A signal is emitted by the excited nuclei or "spins," after the excitation field, $B_1$, is terminated, and this signal may be received and processed to form an image.

When utilizing these "MR" signals to produce images, magnetic field gradients ($G_x$, $G_y$, and $G_z$) are employed for spatial encoding. Typically, the region to be imaged is scanned by a sequence of measurement cycles in which these gradients vary according to the particular localization method being used. The resulting set of received MR signals are digitized and processed to reconstruct the image using one of many well known reconstruction techniques.

The measurement cycle used to acquire each MR signal is performed under the direction of a pulse sequence produced by a pulse sequencer. Clinically available MRI systems store a library of such pulse sequences, which can be prescribed to meet the needs of many different clinical applications. Research MRI systems include a library of clinically-proven pulse sequences, and also enable the development of new pulse sequences.

The MR signals acquired with an MRI system are signal samples of the subject of the examination in Fourier space, or what is often referred to in the art as "k-space." Each MR measurement cycle, or pulse sequence, typically samples a portion of k-space along a sampling trajectory characteristic of that pulse sequence. Most pulse sequences sample k-space in a raster scan-like pattern sometimes referred to as a "spinwarp," "Fourier," "rectilinear," or "Cartesian" scan. The spinwarp scan technique employs a variable amplitude phase encoding magnetic field gradient pulse prior to the acquisition of MR spin-echo signals to phase encode spatial information in the direction of this gradient. In a two-dimensional implementation ("2DFT"), for example, spatial information is encoded in one direction by applying a phase encoding gradient, $G_y$, along that direction, and then an MR signal is acquired in the presence of a readout magnetic field gradient, $G_x$, in a direction orthogonal to the phase encoding direction. The readout gradient present during the MR signal acquisition encodes spatial information in the orthogonal direction. In a typical 2DFT pulse sequence, the magnitude of the phase encoding gradient pulse, $G_y$, is incremented, $\Delta G_y$, in the sequence of measurement cycles, or "views," that are acquired during the scan to produce a set of k-space MR data, from which an entire image can be reconstructed.

There are many other k-space sampling patterns used by MRI systems. These include "radial," or "projection reconstruction," scans in which k-space is sampled as a set of radial sampling trajectories extending outward from the center of k-space, or extending from one quadrant of k-space through the center of k-space to an opposing quadrant of k-space. The pulse sequences utilized for a radial scan are typically characterized by the lack of a phase encoding gradient and the presence of a readout gradient that changes direction from one repetition of the pulse sequence to the next. There are also many k-space sampling methods that are closely related to the radial scan and that sample along a curved k-space sampling trajectory, such as a spiral trajectory, rather than a straight line radial trajectory.

Three-dimensional ultra-short echo time ("UTE") imaging holds the potential both to visualize rapidly decaying nuclear species that would not otherwise be visible and to dramatically improve sampling efficiency. Unfortunately, achieving both of these benefits in a single scan is quite challenging. Short $T_2$ imaging is generally performed with three-dimensional radial sampling schemes because of their robustness to signal decay. While partially compensated by compatibility with compressed sensing ("CS"), these sampling schemes are four times less efficient than Cartesian acquisitions. As a corollary, three-dimensional UTE with twisting trajectories are highly efficient with long readouts. Examples of such trajectories include cones, described by P. Irarrazabal and D. G. Nishimura in "Fast Three Dimensional Magnetic Resonance Imaging," *Magnetic Resonance in Medicine*, 2005; 33(5):656-662; and Fermat looped, orthogonally encoded trajectories ("FLORET"), described by J. G. Pipe, et al., in "A new design and rationale for 3D orthogonally oversampled k-space trajectories," *Magnetic Resonance in Medicine*, 2011; 66(5):1303-1311. However, these sampling schemes suffer from structured artifacts in the presence of off-resonance, data inconsistencies, or undersampling.

It would therefore be desirable to provide a method for magnetic resonance imaging that is amenable to three-dimensional UTE imaging. In particular, it would be desirable to provide a method for three-dimensional UTE imaging in which an efficient sampling scheme that is robust to image artifacts is utilized.

SUMMARY OF THE INVENTION

The present invention overcomes the aforementioned drawbacks by providing a method for magnetic resonance imaging ("MRI") in which a radial cone k-space trajectory is utilized to rapidly and efficiently sample k-space.

It is an aspect of the invention to provide a method for controlling an MRI system in which the MRI system is directed to establish a radial magnetic field gradient that increases in amplitude with time before decreasing in amplitude with time and to establish an oscillating magnetic field gradient while the amplitude of the radial magnetic field gradient is decreasing. The radial magnetic field gradient defines a k-space trajectory portion that extends along an axis outward from an origin along a substantially radial trajectory while the amplitude of the radial magnetic field gradient is increasing. The decreasing portion of the radial magnetic field gradient and the oscillating magnetic field gradient together define a k-space trajectory portion that extends outward along the axis while circumscribing a conical volume having a radius that increases nonlinearly with distance from the origin.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

A method for controlling a magnetic resonance imaging ("MRI") system to produce magnetic field gradients that define a radial cone trajectory in k-space is provided. The radial cone k-space trajectory may be implemented to sample k-space during a data acquisition. An example of a radial cone trajectory is illustrated generally in FIGS. 1-3 and described in more detail below. The radial cone trajectory is designed to maximize the coverage of k-space per repetition time ("TR") period. For example, the radial cone trajectory is designed to maximize the coverage of k-space per single RF excitation.

The radial cone trajectory of the present invention is advantageous over traditional radial trajectories in a number of ways. First, the point spread function of the radial cone trajectory is more diffuse than that for radial trajectories. As a result, the radial cone trajectory inherently reduces streak artifacts compared to radial trajectories. Additionally, the radial cone trajectory samples the periphery of k-space more densely than traditional radial trajectories. As a result, higher spatial frequencies are sampled better with the radial cone trajectory and, therefore, better edge detail will be present in the reconstructed images.

Figure 1:
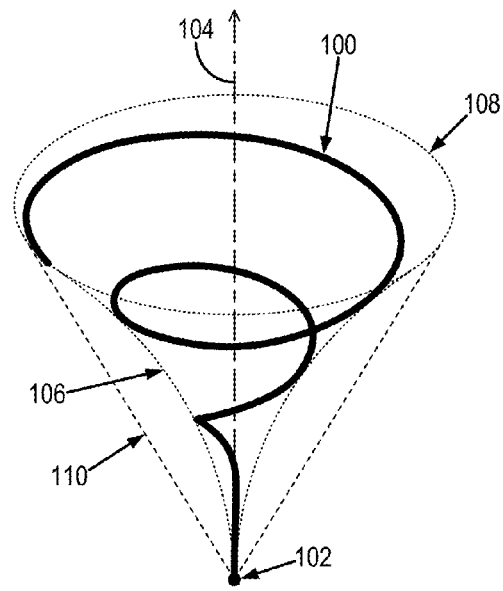
FIG. 1 is an example of a radial cone trajectory in accordance with some embodiments of the present invention.
Figure 2:
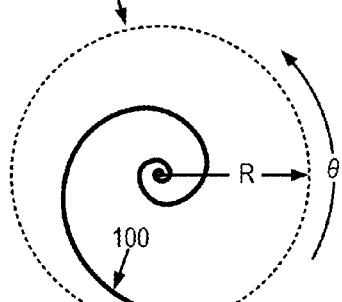
FIG. 2 is a top view of the example radial cone trajectory of FIG. 1.
Figure 3:
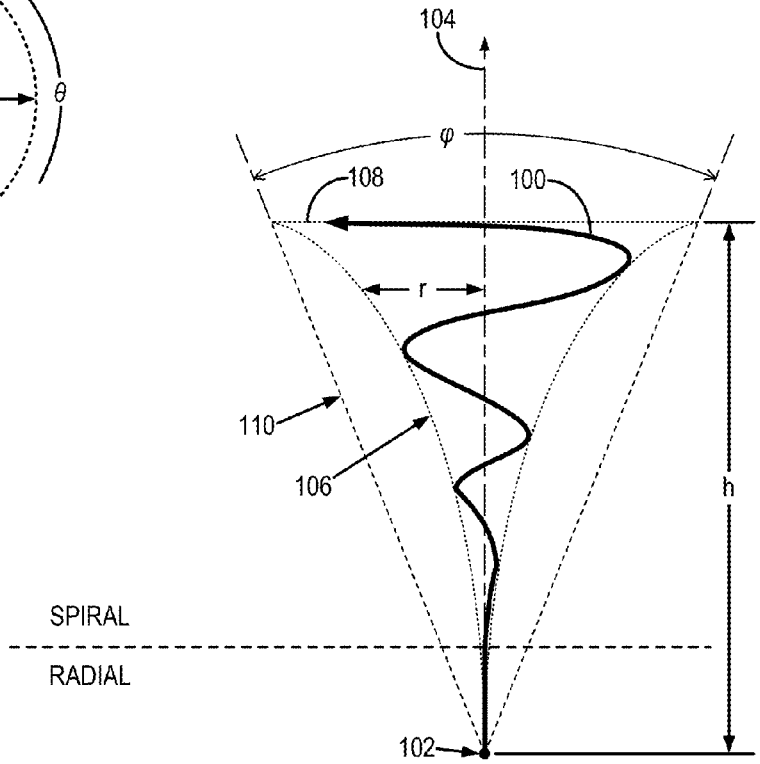
FIG. 3 is an elevational view of the example radial cone trajectory of FIG. 1.

An example of a radial cone k-space trajectory is illustrated in FIGS. 1-3, to which reference is now made. Generally, the radial cone 100 extends outward from an origin 102 in a direction defined by a cone axis 104 and includes two general portions: a radial portion and a spiral portion. In the radial portion, the radial cone 100 extends outward from the origin 102 along a substantially straight, radial line along the cone axis 104. In the spiral portion, the radial cone 100 deviates from the cone axis 104 by circumscribing the surface of a conical volume 106 along a spiraling path.

The conical volume 106 extends from its apex at the origin 102 to its base 108, which as a base radius, R. The cone radius, r, of the conical volume 106 increases nonlinearly with distance from the apex at the origin 102 to the base 108, resulting in a funnel-like shape that becomes increasingly dilated with distance from the origin and the end of the radial portion of the trajectory. The end result is a k-space trajectory that is radially traverses the center of k-space and pseudo-randomly traverses the periphery of k-space. Because the periphery of k-space is traversed in an unstructured manner using the radial cone trajectory, sampling k-space with radial cones is beneficial to compressed sensing applications.

To maintain radial-like properties during the spiral portion of the radial cone trajectory 100, the cone radius, r, is preferably restricted to a fraction of the k-space maximum, $k_{max}$. For example, the cone radius, r, may be restricted to one-eighth the k-space maximum, $$r \in \left[0, \frac{1}{8} \cdot k_{max}\right]. \qquad (1)$$

The conical volume 106 may be viewed as being bounded by a cone 110 that has a linearly varying radius from its apex at the origin 102, to its base, which overlaps the base 108 of the conical volume 106. The opening angle, $\phi$, of the conical volume is defined as follows:

$$\phi = 2 \cdot \tan\left(\frac{R}{h}\right); \qquad (2)$$

where R is the base radius of the conical volume 106 and h is the height of the conical volume 106, which is defined as the distance from the origin 102 to the base 108 along the cone axis 104.

In a multi-shot implementation, each imaging shot samples k-space along one radial cone trajectory and subsequent repetitions of the pulse sequence differ in that a different radial cone trajectory is used. Preferably, each different radial cone differs only by the selection of the cone axis 104 and the cone angle about the cone axis 104 at which the spiral portion of the radial cone trajectory begins. In some instances, the cone axes are distributed isotropically, similar to three-dimensional radial acquisitions. In other instances, however, it may be preferable to distribute the cone axes in a random, pseudo-random, or metric-optimized fashion. The cone angles, $\theta$, may be selected first by a random rotation about the associated cone axis, and may be further refined using by iteratively minimizing the potential energy between the individual imaging shots, thereby minimizing large gaps in k-space coverage, a process which is described below in more detail.

Figure 4:
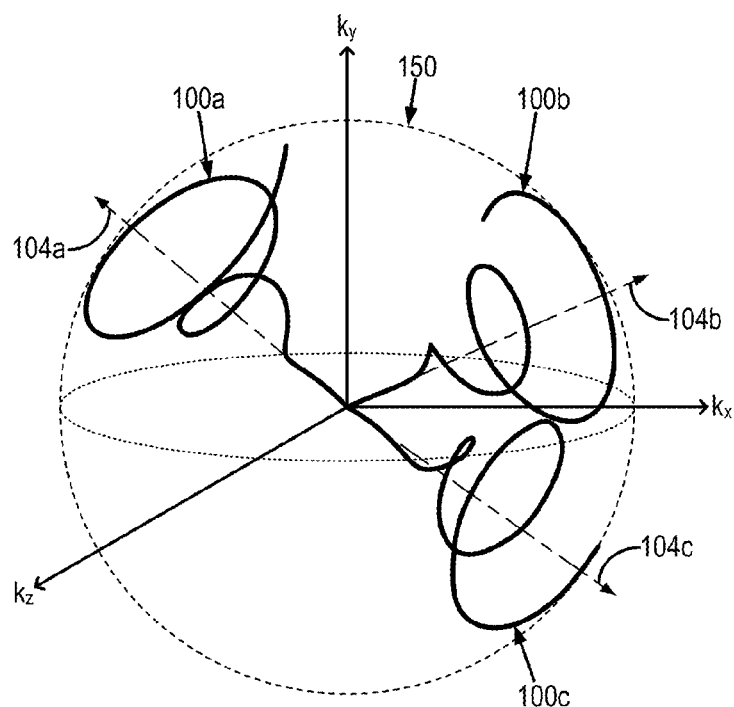
FIG. 4 is an example of multiple radial cone trajectories that share a common origin, but are oriented along different cone axes.

An example of a distribution of multiple radial cone trajectories 100a, 100b, 100c is illustrated in FIG. 4. These trajectories 100a, 100b, 100c each have different orientations. Trajectory 100a is oriented along cone axis 104a, trajectory 100b is oriented along cone axis 104b, and trajectory 100c is oriented along cone axis 104c. Further, each trajectory 100a, 100b, 100c has a different cone angle. The orientation of each radial cone trajectory 100a, 100b, 100c is defined by its cone axis 104a, 104b, 104c. Thus, for a multi-shot implementation, part of the process of designing the radial cone trajectories is selecting the radial trajectories that will define the respective cone axes. The cone axes are distributed in three dimensions, such as radial line segments extending outward from a common origin towards the surface of a sphere 150. The orientation of each cone axis 104a, 104b, 104c would be defined, for example, by three Euler angles, α, β, and γ.

Figure 5:
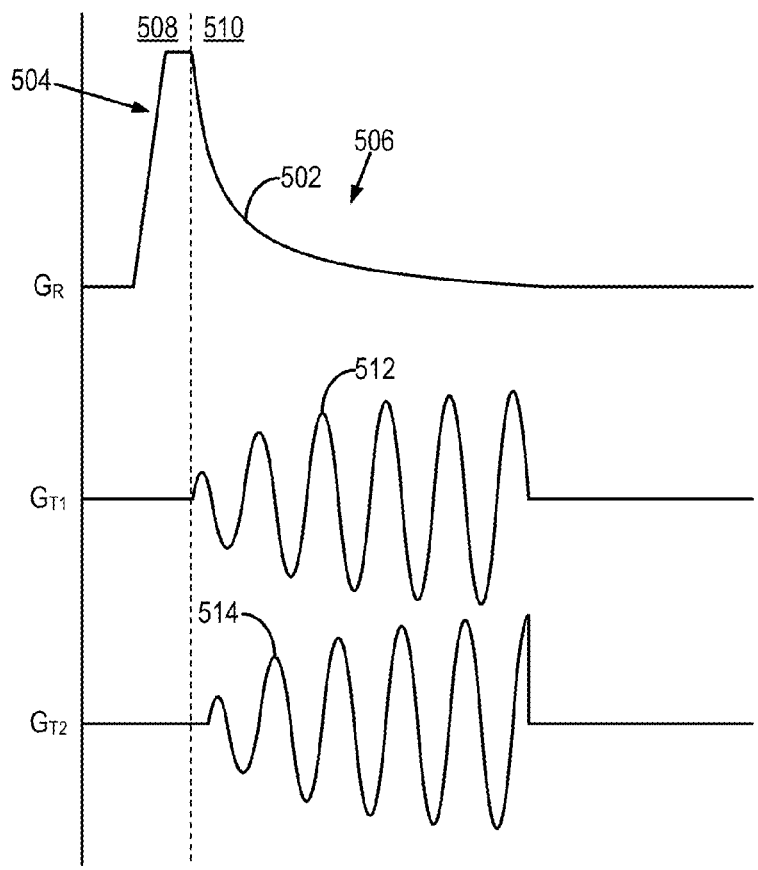
FIG. 5 is an example of a magnetic field gradient waveforms that may be used to produce a radial cone trajectory, such as the radial cone trajectory of FIG. 1.

Referring now to FIG. 5, an example of gradient waveforms that may be used to direct an MRI system to establish magnetic field gradients that result in a radial cone trajectory in accordance with embodiments of the present invention is illustrated. Generally, the radial cone trajectory is defined by magnetic field gradients established using a radial magnetic field gradient waveform 502 and tangential magnetic field gradient waveforms 504, 506. The radial magnetic field gradient waveform 502 may be optimized for signal-to-noise ratio ("SNR") performance by reducing the gradient strength inverse to the k-space radius squared. For example, the radial magnetic field gradient waveform 502 may be designed with an arc-length-based optimization.

In this example, the radial magnetic field gradient waveform 502 includes a rising portion 508 and a falling portion 510. During the rising portion 508 of the radial magnetic field gradient waveform 502, no other magnetic field gradient waveforms are played out; thus, the magnetic field gradient established by the rising portion 508 of the radial magnetic field gradient waveform 502 defines a radial trajectory. The rising portion 508 of the radial magnetic field gradient waveform 502 is designed such that the center of k-space is traversed faster than during the falling portion 510. As a result, solid angle effects are mitigated.

During the falling portion 510 of the radial magnetic field gradient waveform 502, the tangential magnetic field gradient waveforms 504, 506 are played out to establish tangential magnetic field gradients. The tangential magnetic field gradient waveforms 504, 506 are designed to utilize the excess slew rate and gradient power of the radial magnetic field gradient established by the radial magnetic field gradient waveform 502. In general, the tangential magnetic field gradient waveforms 504, 506 are oscillatory waveforms that when played out by the MRI system establish time-varying magnetic field gradients. By way of example, the tangential magnetic field gradient waveforms 504, 506 may be sinusoidal waveforms whose amplitudes increase over their duration, thereby defining a k-space trajectory that spirals outward with increasing distance from the radial axis defined by the radial magnetic field gradient.

In other examples, the tangential magnetic field gradient waveforms 504, 506 may be played out at different times during the radial magnetic field gradient waveform 502. For instance, the tangential magnetic field gradient waveforms 504, 506 may be played out during the rising portion 508 of the radial magnetic field gradient waveform 502. Additionally, in a broadband excitation, the radial magnetic field gradient waveform 502 may start at an amplitude value greater than zero.

General design considerations for the radial cone trajectory are as follows. First, a radial axis is selected as the cone axis 104 for the radial cone trajectory being designed. In addition, a radial magnetic field gradient waveform 502 is computed, which will determine the amount of excess gradient power that can be utilized to generate the spiral portion of the radial cone trajectory 100. Next, the envelope of the radial cone trajectory 100, which is defined by the conical volume 106, is selected. For example, the conical volume 106 may be selected by choosing a desired opening angle, φ, and rate at which the cone radius, r, is to increase with distance from the origin 102. By way of example, the opening angle, φ, may be selected as 14.25 degrees, which corresponds to a base radius, R, equal to one-eighth of the maximum k-space radius sampled in accordance with Eqn. (1). It will be appreciated by those skilled in the art, however, that other opening angles may be used. Lastly, the rotation per time that provides the most turns within the allotted excess gradient power is computed.

Figure 6:
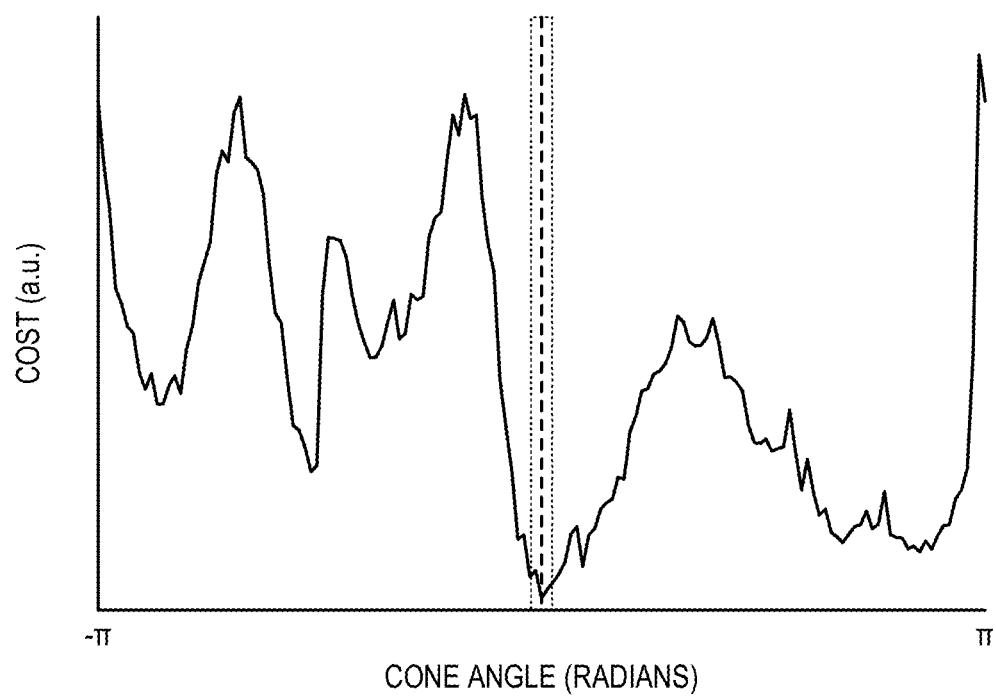
FIG. 6 is an example of a plot of minimization cost versus cone angle.

When designing radial cone trajectories, particularly for multi-shot implementations, a method for optimally selecting the cone angles so as to reduce overlaps between adjacent radial cones in a multi-shot radial cone sampling scheme may be used. By way of example, an iterative greedy algorithm may be used to minimize the overlap between adjacent radial cones as a function of their radial cone angles. The result of this process is illustrated in the plot of FIG. 6, which shows a plot of a cost representative of overlap between adjacent radial cones as a function of radial cone angle. The global minimum is selected as the radial cone angle for the trajectory being designed. This process may be repeated for each radial cone trajectory in the multi-shot sampling scheme so as to provide coverage of k-space with the minimal amount of overlap and, therefore, redundancy. Other optimization schemes, including charge repulsion algorithms, may also be utilized.

By way of example, a pulse sequence making use of the radial cone trajectory may be designed as follows. The pulse sequence may be a multi-shot sequence that utilizes 2,500 shots and, therefore, 2,500 different radial cones trajectories. Each shot may have, for example, a short readout, such as 1.2 milliseconds; an ultrashort echo time, such as 80 microseconds; and isotropic spatial resolution, such as 1.0 mm isotropic resolution. These example acquisition parameters provide about a sixty-fold acceleration over what is achievable by a similar number of shots using a radial trajectory.

Figure 7:
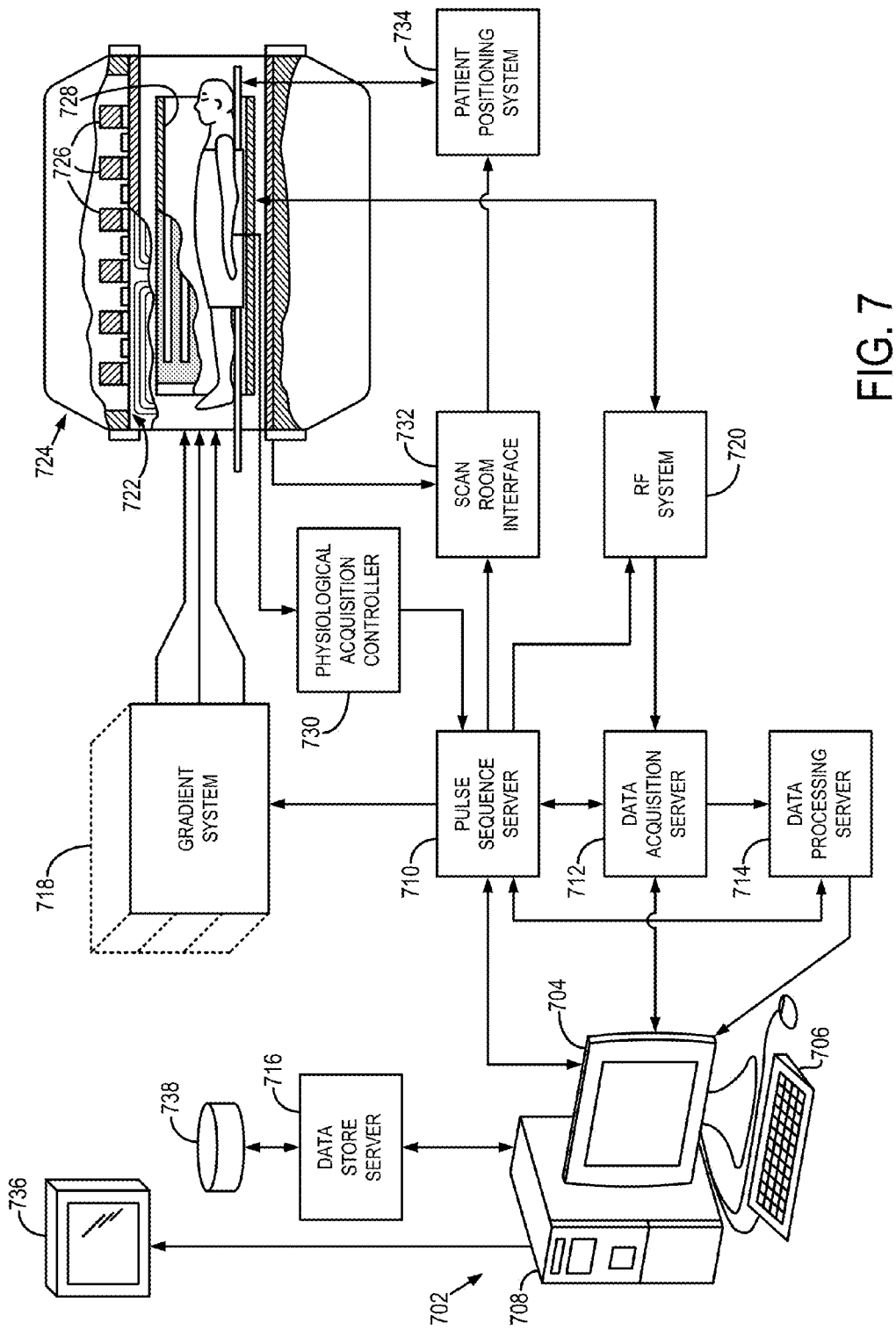
FIG. 7 is a block diagram of an example magnetic resonance imaging ("MRI") system that may implement the present invention.

Referring particularly now to FIG. 7, an exemplary magnetic resonance imaging ("MRI") system 700 is illustrated. The MRI system 700 includes a workstation 702 having a display 704 and a keyboard 706. The workstation 702 includes a processor 708, such as a commercially available programmable machine running a commercially available operating system. The workstation 702 provides the operator interface that enables scan prescriptions to be entered into the MRI system 700. The workstation 702 is coupled to four servers: a pulse sequence server 710; a data acquisition server 712; a data processing server 714; and a data store server 716. The workstation 702 and each server 710, 712, 714, and 716 are connected to communicate with each other.

The pulse sequence server 710 functions in response to instructions downloaded from the workstation 702 to operate a gradient system 718 and a radiofrequency ("RF") system 720. Gradient waveforms necessary to perform the prescribed scan are produced and applied to the gradient system 718, which excites gradient coils in an assembly 722 to produce the magnetic field gradients $G_x$, $G_y$, and $G_z$ used for position encoding MR signals. The gradient coil assembly 722 forms part of a magnet assembly 724 that includes a polarizing magnet 726 and a whole-body RF coil 728.

RF excitation waveforms are applied to the RF coil 728, or a separate local coil (not shown in FIG. 7), by the RF system 720 to perform the prescribed magnetic resonance pulse sequence. Responsive MR signals detected by the RF coil 728, or a separate local coil (not shown in FIG. 7), are received by the RF system 720, amplified, demodulated, filtered, and digitized under direction of commands produced by the pulse sequence server 710. The RF system 720 includes an RF transmitter for producing a wide variety of RF pulses used in MR pulse sequences. The RF transmitter is responsive to the scan prescription and direction from the pulse sequence server 710 to produce RF pulses of the desired frequency, phase, and pulse amplitude waveform. The generated RF pulses may be applied to the whole body RF coil 728 or to one or more local coils or coil arrays (not shown in FIG. 7).

The RF system 720 also includes one or more RF receiver channels. Each RF receiver channel includes an RF amplifier that amplifies the MR signal received by the coil 728 to which it is connected, and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2} \quad (3);$$

and the phase of the received MR signal may also be determined:

$$\varphi = \tan^{-1}\left(\frac{Q}{I}\right). \quad (4)$$

The pulse sequence server 710 also optionally receives patient data from a physiological acquisition controller 730. The controller 730 receives signals from a number of different sensors connected to the patient, such as electrocardiograph ("ECG") signals from electrodes, or respiratory signals from a bellows or other respiratory monitoring device. Such signals are typically used by the pulse sequence server 710 to synchronize, or "gate," the performance of the scan with the subject's heart beat or respiration.

The pulse sequence server 710 also connects to a scan room interface circuit 732 that receives signals from various sensors associated with the condition of the patient and the magnet system. It is also through the scan room interface circuit 732 that a patient positioning system 734 receives commands to move the patient to desired positions during the scan.

The digitized MR signal samples produced by the RF system 720 are received by the data acquisition server 712. The data acquisition server 712 operates in response to instructions downloaded from the workstation 702 to receive the real-time MR data and provide buffer storage, such that no data is lost by data overrun. In some scans, the data acquisition server 712 does little more than pass the acquired MR data to the data processor server 714. However, in scans that require information derived from acquired MR data to control the further performance of the scan, the data acquisition server 712 is programmed to produce such information and convey it to the pulse sequence server 710. For example, during prescans, MR data is acquired and used to calibrate the pulse sequence performed by the pulse sequence server 710. Also, navigator signals may be acquired during a scan and used to adjust the operating parameters of the RF system 720 or the gradient system 718, or to control the view order in which k-space is sampled. The data acquisition server 712 may also be employed to process MR signals used to detect the arrival of contrast agent in a magnetic resonance angiography ("MRA") scan. In all these examples, the data acquisition server 712 acquires MR data and processes it in real-time to produce information that is used to control the scan.

The data processing server 714 receives MR data from the data acquisition server 712 and processes it in accordance with instructions downloaded from the workstation 702. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 714 are conveyed back to the workstation 702 where they are stored. Real-time images are stored in a data base memory cache (not shown in FIG. 7), from which they may be output to operator display 712 or a display 736 that is located near the magnet assembly 724 for use by attending physicians. Batch mode images or selected real time images are stored in a host database on disc storage 738. When such images have been reconstructed and transferred to storage, the data processing server 714 notifies the data store server 716 on the workstation 702. The workstation 702 may be used by an operator to archive the images, produce films, or send the images via a network to other facilities.

The proposed radial cones trajectory allows data acquisition using a short, three-dimensional, ultrashort echo time ("3D UTE") readout with high data collection efficiency and improved performance with compressed sensing. Comparisons to three-dimensional radial sampling show improved performance over traditional radial sampling schemes. Because the radial cones trajectory uses a single trajectory per shot, it is easy to implement and characterize on standard MRI systems.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for controlling a magnetic resonance imaging (MRI) system, the steps of the method comprising:
   a) directing the MRI system to establish a radial magnetic field gradient that increases in amplitude with time before decreasing in amplitude with time;
   b) directing the MRI system to establish an oscillating magnetic field gradient while the amplitude of the radial magnetic field gradient is decreasing; and
   wherein the radial magnetic field gradient defines a k-space trajectory portion that extends along an axis outward from an origin to an end point along a substantially radial trajectory while the amplitude of the radial magnetic field gradient is increasing, and the radial magnetic field gradient and oscillating magnetic field gradient together define a k-space trajectory portion that extends outward from the end point along the axis while circumscribing a conical volume having a radius that increases nonlinearly with distance from the origin.

2. The method as recited in claim 1 in which the amplitude of the radial magnetic field gradient increases linearly and decreases nonlinearly.

3. A method for producing an image of a subject with a magnetic resonance imaging (MRI) system, the steps of the method comprising:
   a) applying a radio frequency (RF) excitation field to the subject with the MRI system;
   b) applying magnetic field gradients with the MRI system that define a k-space trajectory oriented along an axis, the k-space trajectory extending outward from an origin to an end point along a substantially radial k-space trajectory portion that is oriented along the axis before extending outward from the end point while circumscribing a conical volume oriented along the axis and having a radius that varies between the origin and a base of the conical volume;

c) acquiring k-space data by sampling magnetic resonance signals formed in response to the RF excitation pulse applied in step a) during the performance of step b) such that the k-space data is acquired while sampling k-space along the k-space trajectory defined by the magnetic field gradients applied in step b); and d) reconstructing an image of the subject from the k-space data acquired in step c).

4. The method as recited in claim 3 in which steps a)-c) are repeated a plurality of times to acquire a set of k-space data, and in which the magnetic field gradients applied in step b) are adjusted during each repetition such that the k-space trajectory defined by the magnetic field gradients is oriented along a different axis during each repetition.

5. The method as recited in claim 4 in which the magnetic field gradients applied in step b) are adjusted during each repetition such that the orientation of the axis is pseudo-randomly changed.

6. The method as recited in claim 4 in which the magnetic field gradients applied in step b) are adjusted during each repetition such that a cone angle that defines an angle in a plane perpendicular to the axis at which the k-space trajectory begins circumscribing the conical volume is changed for each repetition.

7. The method as recited in claim 6 in which the cone angle is selected so as to minimize overlap between adjacent k-space trajectories.

8. The method as recited in claim 3 in which the magnetic field gradients applied in step b) include a radial magnetic field gradient and at least one oscillating magnetic field gradient.

9. The method as recited in claim 8 in which the amplitude of the radial magnetic field gradient increases with time before decreasing with time and in which the at least one oscillating magnetic field gradient is applied while the amplitude of the radial magnetic field gradient is decreasing.

10. The method as recited in claim 9 in which the amplitude of the radial magnetic field gradient applied in step b) decreases nonlinearly.

\* \* \* \* \*